United States Patent
Kim et al.

(10) Patent No.: US 9,576,684 B1
(45) Date of Patent: Feb. 21, 2017

(54) SEMICONDUCTOR DEVICE AND DEVICE FOR A SEMICONDUCTOR DEVICE

(71) Applicant: SK hynix Inc., Icheon-si, Gyeonggi-do (KR)

(72) Inventors: Jae Il Kim, Icheon-si (KR); Seung Geun Baek, Seoul (KR); Don Hyun Choi, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 14/933,203

(22) Filed: Nov. 5, 2015

(30) Foreign Application Priority Data

Aug. 21, 2015 (KR) .................. 10-2015-0117929

(51) Int. Cl.
| G11C 7/00 | (2006.01) |
| G11C 29/00 | (2006.01) |
| G11C 11/4096 | (2006.01) |
| G11C 11/408 | (2006.01) |
| G11C 11/406 | (2006.01) |

(52) U.S. Cl.
CPC ............ *G11C 29/76* (2013.01); *G11C 11/406* (2013.01); *G11C 11/4085* (2013.01); *G11C 11/4087* (2013.01); *G11C 11/4096* (2013.01)

(58) Field of Classification Search
CPC .... G11C 29/76; G11C 11/406; G11C 11/4085; G11C 11/4087; G11C 11/4096
See application file for complete search history.

(56) References Cited

U.S. PATENT DOCUMENTS

| 7,379,369 B2 | 5/2008 | Lee |
| 8,908,461 B2 | 12/2014 | Kim et al. |
| 9,378,801 B2 * | 6/2016 | Oh .................. G11C 11/40618 |
| 2003/0112689 A1 * | 6/2003 | Natsui .............. G11C 11/406 365/222 |
| 2005/0094460 A1 * | 5/2005 | Cho .................. G11C 8/08 365/222 |
| 2008/0130394 A1 * | 6/2008 | Dono ................ G11C 11/406 365/222 |
| 2008/0298154 A1 * | 12/2008 | Mae ................. G11C 11/406 365/222 |
| 2009/0109773 A1 * | 4/2009 | Abe ................. G11C 11/406 365/200 |
| 2012/0106277 A1 * | 5/2012 | Kwean ............. G11C 11/40622 365/194 |

* cited by examiner

*Primary Examiner* — Toan Le
(74) *Attorney, Agent, or Firm* — William Park & Associates Ltd.

(57) ABSTRACT

Various embodiments generally relate to a semiconductor device and a device for a semiconductor device, and more particularly, to a technology relating to a margin of a data retention time. The semiconductor device may include a repair detection unit configured to determine whether an inputted address is a repair address and output a repair detection signal. The semiconductor device may include a refresh control unit configured to simultaneously activate two or more word lines in response to a refresh command signal and sequentially activate the two or more word lines according to the repair detection signal.

25 Claims, 7 Drawing Sheets

SEMICONDUCTOR DEVICE AND DEVICE FOR A SEMICONDUCTOR DEVICE

CROSS-REFERENCES TO RELATED APPLICATION

The present application claims priority under 35 U.S.C. §119(a) to Korean application number 10-2015-0117929, filed on Aug. 21, 2015, in the Korean Intellectual Property Office, which is incorporated herein by reference in its entirety.

BACKGROUND

1. Technical Field

Various embodiments generally relate to a semiconductor device and a device for a semiconductor device, and more particularly, to a technology relating to a margin of a data retention time.

2. Related Art

In general, a semiconductor memory device including double data rate synchronous DRAM (DDR SDRAM) includes a very large number of memory cells. The integration degree of semiconductor memory devices is increased according to the development of a process technology, and thus the number of memory cells is further increased. If any one of such memory cells fails, a semiconductor memory device including the fail memory cell must be discharged because it does not perform a required operation.

As the process technology of the semiconductor memory device advances, defects occur in only some memory cells. It is very inefficient to discard the entire semiconductor memory device due to these failed memory cells when considering the yield of products.

Accordingly, in order to supplement such failed memory cells, redundancy memory cells are also included in a semiconductor memory device in addition to the normal memory cells.

A redundancy memory cell is a circuit for repairing failed memory (hereinafter referred to as a "target repair memory cell") if a failure occurs in a normal memory cell.

More specifically, for example, with a read or write operation, when a target repair memory cell is accessed, a normal memory cell not the target repair memory cell is internally accessed. In this case, the accessed normal memory cell is a redundancy memory cell.

Accordingly, when an address corresponding to a target repair memory cell is received, a semiconductor memory device performs an operation for accessing a redundancy memory cell other than the target repair memory cell (hereinafter referred to as a "repair operation"). A normal operation is guaranteed for the semiconductor memory device through such a repair operation.

SUMMARY

In an embodiment, a semiconductor device may be provided. The semiconductor device may include a repair detection unit configured to determine whether an inputted address is a repair address and output a repair detection signal. The semiconductor device may include a refresh control unit configured to substantially simultaneously or simultaneously activate two or more word lines in response to a refresh command signal and sequentially activate the two or more word lines when the repair detection signal is enabled.

In an embodiment, a semiconductor device may be provided. The semiconductor device may include a repair signal generation unit configured to compare an inputted address with a repair address and output a repair selection signal. The semiconductor device may include a combination unit configured to output a repair detection signal by combining the repair selection signal and a repair check signal. The semiconductor device may include a word line driving control unit configured to control two or more word lines in response to a refresh command signal so that the two or more word lines are simultaneously activated or substantially simultaneously activated. The semiconductor device may include a pulse width control unit configured to generate two or more word line driving signals each having a pulse width smaller than a pulse width of the refresh command signal in response to the output of the word line driving control unit. The semiconductor device may include a selection unit configured to select the output of the word line driving control unit in response to the repair detection signal and output the selected output to the two or more word lines or to select the output of the pulse width control unit and sequentially activate the two or more word lines.

In an embodiment, a device for a semiconductor device may be provided. The device may include a refresh control unit configured to increase a refresh rate by simultaneously activating two or more word lines included in a single bank in response to a single refresh command signal, and to sequentially activate the two or more word lines according to a repair detection signal.

DETAILED DESCRIPTION

Hereinafter, a semiconductor device will be described below with reference to the accompanying drawings through various examples of embodiments.

In general, a redundancy circuit for such a repair operation may be included in each of a plurality of banks included in a semiconductor memory device. Each of the banks may include a cell mat configured to include a plurality of unit cells, a row control region configured to include circuits for controlling row access, and a column control region configured to include circuits for controlling column access.

The redundancy circuit may be divided into a row redundancy circuit for repairing the row address of a fail unit cell and a column redundancy circuit for repairing the column address of a fail unit cell. The row redundancy circuit and the column redundancy circuit may be respectively included in the row control region and column control region of each bank.

Various embodiments may be directed to a technology for skipping a fail word line and driving a repaired word line when two or more word lines are activated within a single bank.

Figure 1:
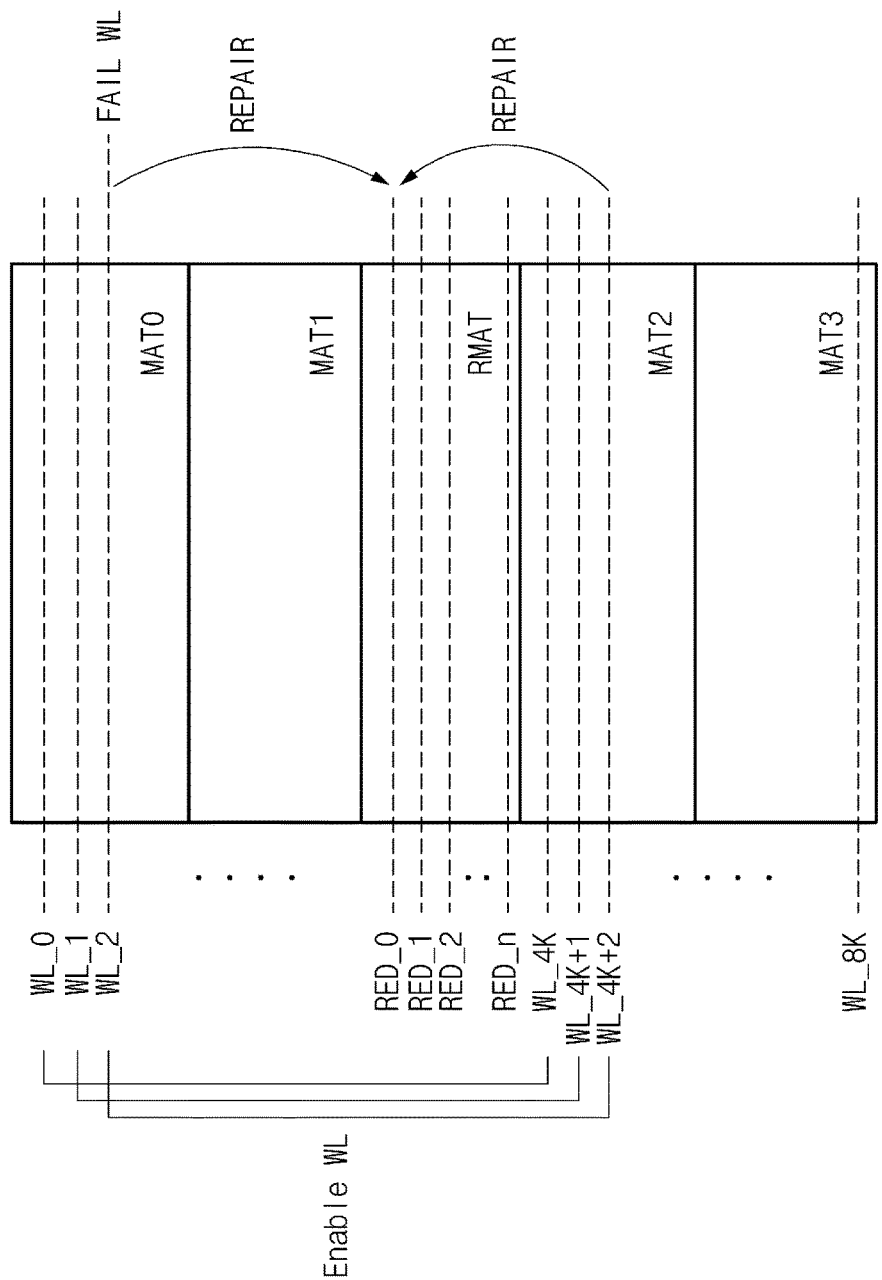
FIGS. 1 and 2 are diagrams illustrating a representation of an example of a repair operation and a refresh operation.
Figure 2:
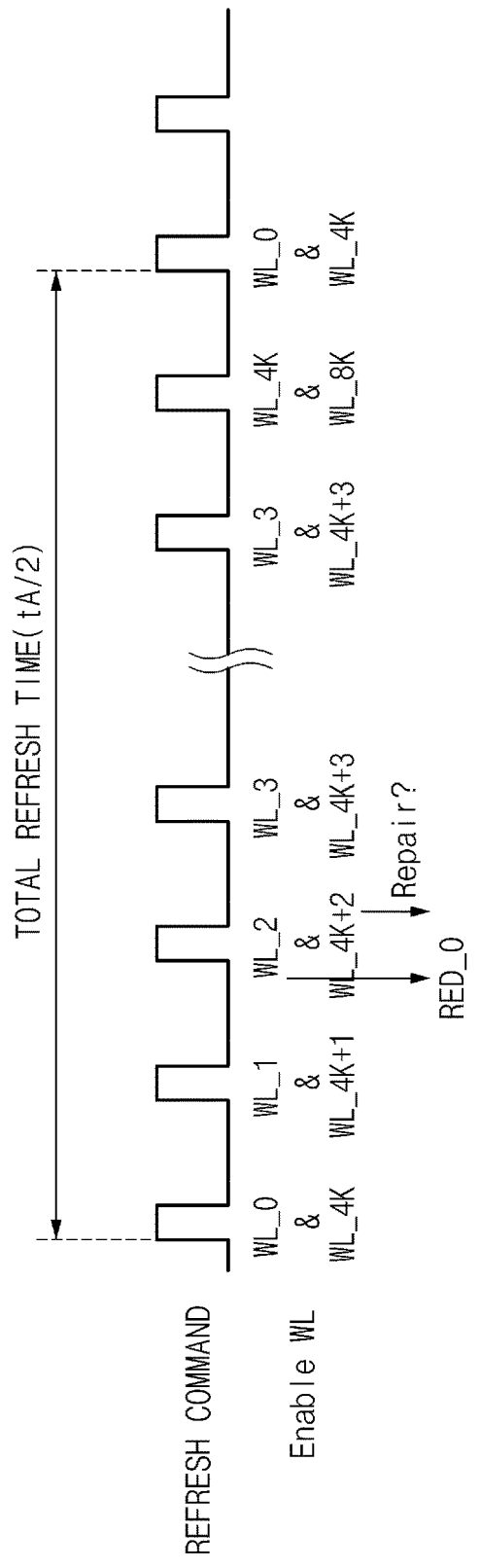

FIGS. 1 and 2 are diagrams illustrating a representation of an example of a repair operation and a refresh operation.

A semiconductor device is divided into a plurality of banks and may be driven. Each of the plurality of banks may include a plurality of mats MAT0~MAT3 each including a plurality of memory cells. For example, a memory cell array may be divided into sets of the plurality of unit memory cell mats MAT0~MAT3. A plurality of the mats MAT0~MAT3 may be arranged in a row direction and column direction, forming a plurality of mat rows and a plurality of mat columns.

The plurality of mats MAT0~MAT3 may include a plurality of word lines WL_0~WL_8K and may select the row lines of memory cells. For example, it may be assumed that the number of word lines within a single bank is 8 K.

In an embodiment, some mats that belong to the plurality of mats MAT0~MAT3 and that are disposed in a center area may be redundant mats RMAT used for a repair. The redundant mat RMAT may include a plurality of redundant word lines RED_0~RED_n and may replace a fail word line when a repair operation is performed.

As the integration degree of semiconductor devices is increased, finer patternization may be provided. In particular, the capacity of a memory device of semiconductor devices is rapidly increased as the semiconductor devices are highly integrated. An increase in the capacity of memory according to the development of the technology means an increase in the number of memory cells included in a single chip. As the number of memory cells increases, the number of fail memory cells also increases.

A single fail cell is not permitted in a semiconductor device. Accordingly, a normal redundant cell for replacing a fail memory cell is included in a normal cell in preparation for a case where a memory cell fails. An operation for substituting such a fail normal cell with a normal redundant cell is called a repair operation.

For example, a repair address indicative of the location of a fail normal cell is found out using a semiconductor test device, and a repair address may be stored by programming a fuse included in a repair fuse circuit.

After the repair address is stored in the repair fuse circuit, when an external input address for a failed normal cell is received, the repair address and external input address stored in the repair fuse circuit are determined as the same. Accordingly, a repair operation is performed in such a way as to block access to an actual failed normal cell and to permit access to a redundant cell by deactivating a normal path through which the actual fail normal cell may be accessed by the operation of a row decoder or column decoder and activating the redundant path.

When a single word line is activated, the number of word lines versus the retention time of a storage cell is calculated, and the same number of commands is applied. Therefore, if a repaired word line is the subject of a repair, the substituted redundant word line RED_0 of the region of the redundant mat RMAT is automatically activated, and thus a normal operation is performed after a repair operation.

In order to improve the operation margin and time of a semiconductor device, two word lines may be simultaneously activated or substantially simultaneously activated. In an embodiment, the word lines WL_0 and WL_4K, the word lines WL_1 and WL_4K+1, and the word lines WL_2 and WL_4K+2 that belong to the plurality of word lines WL_0~WL_8K and that are not adjacent to each other may be simultaneously activated.

For example, the data retention time of a storage cell is assumed to be tA. In this example, a refresh operation for enabling all the 8K word lines may need to be performed during the time tA.

For example, when two word lines are simultaneously activated, a total refresh time is tA/2. When a refresh command is applied during the refresh time of tA/2, a pair of the two word lines WL_0 and WL_4K of the plurality of word lines WL_0~WL_8K may be activated, a pair of the two word lines WL_1 and WL_4K+1 may be activated, or a pair of the two word lines WL_2 and WL_4K+2 may be activated.

For example, when a failure occurs in the normal word line WL_2, the normal word line WL_2 may be substituted with the redundant word line RED_0. That is, if the word line WL_2 has been repaired, when a refresh command is applied, the substituted redundant word line RED_0 is activated.

When the word lines WL_2 and WL_4K+2 are simultaneously activated as described above when a refresh operation is performed, it may be difficult to determine whether the word line WL_b_2 of the two word lines is a repaired word line or whether the word line WL_4K+2 of the two word lines is a repaired word line. That is, it may be difficult to determine whether a word line substituted with the redundant word line RED_0 corresponds to the word line WL_2 or the word line WL_4K+2. Accordingly, when a repaired word line is refreshed, an error may occur in cell data.

In order to secure the margin of the data retention time of a storage cell, the loss of stored data may be prevented by performing a refresh operation. However, a possibility that data may be lost increases because the data retention time may be gradually decreased due to the process and an external environment.

In order to prevent such a problem, a method of increasing the number of refreshes by generating an additional internal signal may be proposed. However, in this example, there is a possibility that a malfunction may occur because a word line that has been repaired and is not used is activated.

Figure 3:
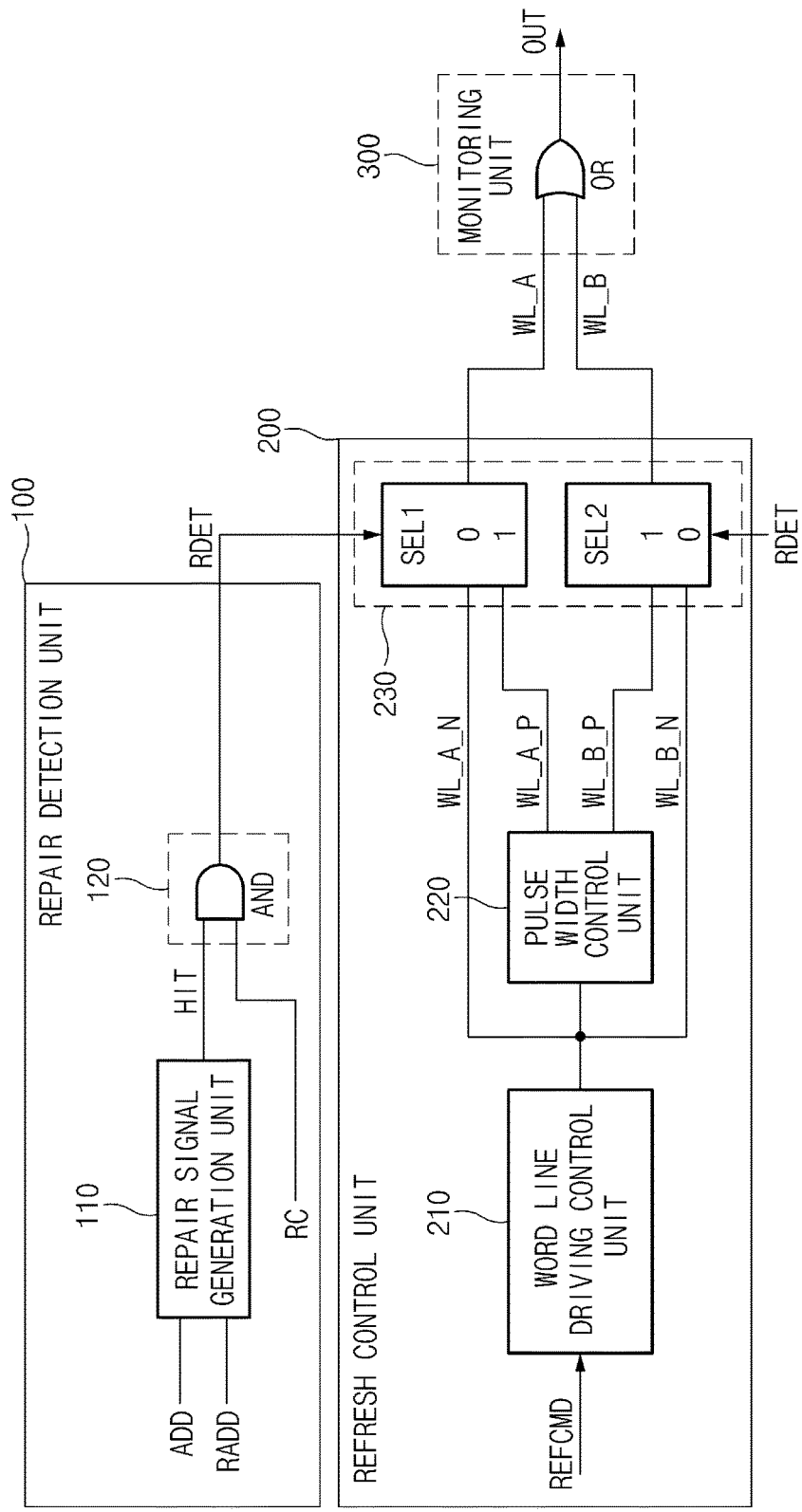
FIG. 3 is a diagram illustrating a representation of an example of the configuration of a semiconductor device according to an embodiment.

FIG. 3 is a diagram illustrating a representation of an example of the configuration of a semiconductor device according to an embodiment.

The semiconductor device according to an embodiment may include a repair detection unit 100, a refresh control unit 200, and a monitoring unit 300.

The repair detection unit 100 may include a repair signal generation unit 110 and a combination unit 120. The repair signal generation unit 110 outputs a repair selection signal HIT by combining an address ADD and a repair address RADD.

The repair signal generation unit 110 compares the address ADD with the repair address RADD and generates the repair selection signal HIT. For example, if the input address ADD is the repaired repair address RADD, the repair signal generation unit 110 outputs the repair selection signal HIT of a high level.

In an embodiment, the combination unit 120 outputs a repair detection signal RDET by combining the repair selection signal HIT and a repair check signal RC. The combination unit 120 may include a logic element, for example but not limited to, an AND gate AND for performing an AND operation on the repair selection signal HIT and the repair check signal RC. In an embodiment, the combination unit 120 activates and outputs the repair detection signal RDET when both the repair selection signal HIT and the repair check signal RC are enabled.

In an embodiment, the refresh control unit 200 may include a word line driving control unit 210, a pulse width control unit 220, and a selection unit 230. The word line driving control unit 210 performs control so that two or more word lines WL_A and WL_B not adjacent to each other are simultaneously activated when a refresh command signal REFCMD is applied in order to increase the refresh rate. The word line driving control unit 210 outputs word line driving signals WL_A_N and WL_B_N in response to the refresh command signal REFCMD.

In an embodiment, the refresh rate is increased by simultaneously enabling the two word lines WL_A and WL_B within a single bank in response to a single refresh command signal REFCMD. Accordingly, an embodiment can solve a reduction of the data retention time of a storage cell attributable to the scale down of a semiconductor device (e.g., DRAM) or the deterioration of cell characteristics.

In an embodiment, the pulse width control unit 220 performs control so that each of the word line driving signals WL_A_P and WL_B_P has a half pulse width when the refresh command signal REFCMD is applied. For example, when the refresh command signal REFCMD is enabled, the pulse width control unit 220 performs control so that each of the word line driving signals WL_A_P and WL_B_P has a pulse size half the size of the pulse width of the refresh command signal REFCMD.

In an embodiment, the selection unit 230 outputs the word line driving signals WL_A_N and WL_B_N, output by the word line driving control unit 210, to respective word lines WL_A and WL_B without a change or outputs the word line driving signals WL_A_P and WL_B_P, each having a half pulse width, to the respective word lines WL_A and WL_B in response to the repair detection signal RDET.

For example, when a level of the repair detection signal RDET is logic "0", the selection unit 230 selects the word line driving signals WL_A_N and WL_B_N applied by the word line driving control unit 210 and activates the word lines WL_A and WL_B. For example, when a level of the repair detection signal RDET is logic "1", the selection unit 230 selects the word line driving signals WL_A_P and WL_B_P, that is, the output of the pulse width control unit 220, and activates the word lines WL_A and WL_B.

The selection unit 230 may include a first selection unit SEL1 configured to select the pulse width of the word line WL_A and a second selection unit SEL2 configured to select the pulse width of the word line WL_B.

For example, when a level of the repair detection signal RDET is logic "0", the first selection unit SEL1 selects the word line driving signal WL_A_N applied by the word line driving control unit 210 and activates the word line WL_A so that it has the same pulse width as the refresh command signal REFCMD. For example, when a level of the repair detection signal RDET is logic "1", the first selection unit SEL1 selects the word line driving signal WL_A_P, that is, the output of the pulse width control unit 220, and activates the word line WL_A so that it has a half pulse width.

In an embodiment, when a level of the repair detection signal RDET is logic "0", the second selection unit SEL2 selects the word line driving signal WL_B_N applied by the word line driving control unit 210 and activates the word line WL_B so that it has the same pulse width as the refresh command signal REFCMD. For example, when a level of the repair detection signal RDET is logic "1", the second selection unit SEL2 selects the word line driving signal WL_B_P, that is, the output of the pulse width control unit 220, and activates the word line WL_B so that it has a half pulse width.

For example, it may be assumed that the word line WL_2 has failed and has been substituted with the redundant word line RED_0. In this example, when the refresh command signal REFCMD is applied, the word line WL_2 that belongs to the word lines WL_2 and WL_4K+2 and that has been substituted needs to be disabled, and the word line WL_4K+2 needs to be activated.

That is, when the substituted word line WL_2 is deactivated and only the redundant word line RED_0 is activated, the malfunction of the semiconductor device occurring because a fail word line is activated can be prevented.

The selection unit 230 according to an embodiment does not simultaneously activate the two word lines WL_2 and WL_4K+2 when the repair detection signal RDET is enabled, but sequentially activates the word line WL_2 and the word line WL_4K+2. That is, after the redundant word line RED_0 that substitutes the word line WL_2 is activated, the remaining word line WL_4K+2 is activated.

As described above, an embodiment can enhance a refresh characteristic by detecting a repaired word line within a single bank, skipping a fail word line, and driving a substituted word line when two word lines are simultaneously activated.

In an embodiment, the monitoring unit 300 monitors the state of the word lines WL_A and WL_B and externally outputs an output signal OUT. The monitoring unit 300 may include a logic gate, for example but not limited to, an OR gate OR configured to perform an OR operation on the word lines WL_A and WL_B. The monitoring unit 300 enables the output signal OUT to a high level when at least one of the two word lines WL_A and WL_B is activated and outputs the enabled output signal OUT.

Figure 4:
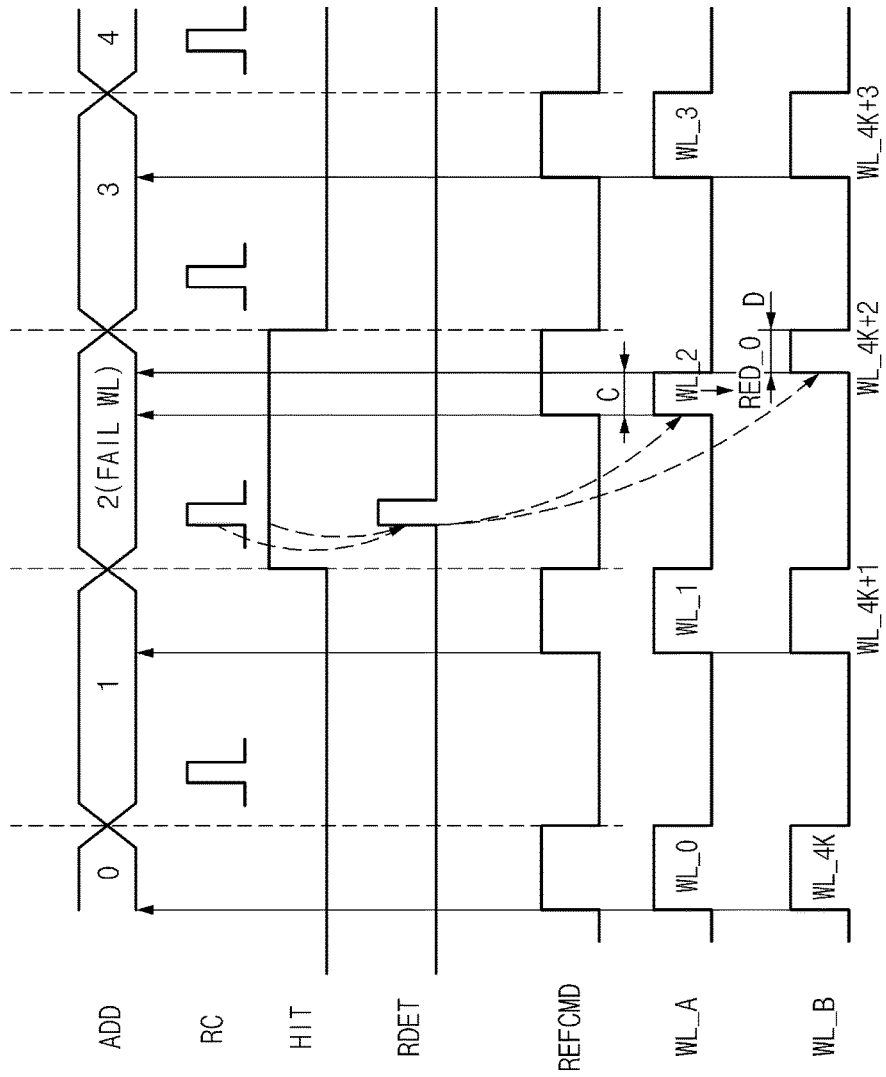
FIG. 4 is an operational timing diagram regarding the semiconductor device of FIG. 3.

FIG. 4 is an operational timing diagram regarding the semiconductor device of FIG. 3.

First, the repair signal generation unit 110 compares the address ADD with the repair address RADD and generates the repair selection signal HIT. For example, if the input address ADD is the repair address RADD, the repair signal generation unit 110 outputs the repair selection signal HIT of a high level. In this example, after a first address is counted after a refresh operation and changed to a second address, the repair signal generation unit 110 compares the address ADD with the repair address RADD.

For example, it may be assumed that the word line WL_2 is a fail word line. If the address ADD "2" of the input addresses ADD fails and that the word line WL_2 corresponding to the address ADD "2" is substituted with the redundant word line RED_0, the repair address RADD is enabled. In response thereto the repair signal generation unit 110 outputs the repair selection signal HIT of a high level in a pulse interval in which the address ADD "2" is enabled.

In an embodiment, whenever a new address ADD is received, the repair check signal RC is enabled with a high level pulse. When a level of the repair selection signal HIT shifts to a high level in the state in which the repair check signal RC has been enabled to a high level, the repair detection unit 120 outputs the repair detection signal RDET of a high level.

When the repair detection signal RDET is enabled to a high level, the selection unit 230 is activated to a logic level "1" and selects the word line driving signals WL_A_P and WL_B_P, that is, the output of the pulse width control unit 220. In this example, the pulse width control unit 220 performs control so that each of the word line driving signals WL_A_P and WL_B_P has a pulse size half the size of the pulse width of the refresh command signal REFCMD in the interval in which the refresh command signal REFCMD is enabled.

Accordingly, when the repair detection signal RDET is enabled, the selection unit 230 outputs the word line driving signals WL_A_P and WL_B_P, each having a half pulse width, to the respective word lines WL_2 and WL_4K+2.

That is, during an interval C in the interval in which the refresh command signal REFCMD is enabled, the selection unit 230 performs control so that the remaining word line WL_4K+2 is activated during an interval D after the substituted redundant word line RED_0 of the word line WL_2 is activated. During the high pulse interval of the refresh command signal REFCM, the redundant word line RED_0 is first activated, and the word line WL_4K+2 is activated at a point of time at which the redundant word line RED_0 is disabled.

Figure 5:
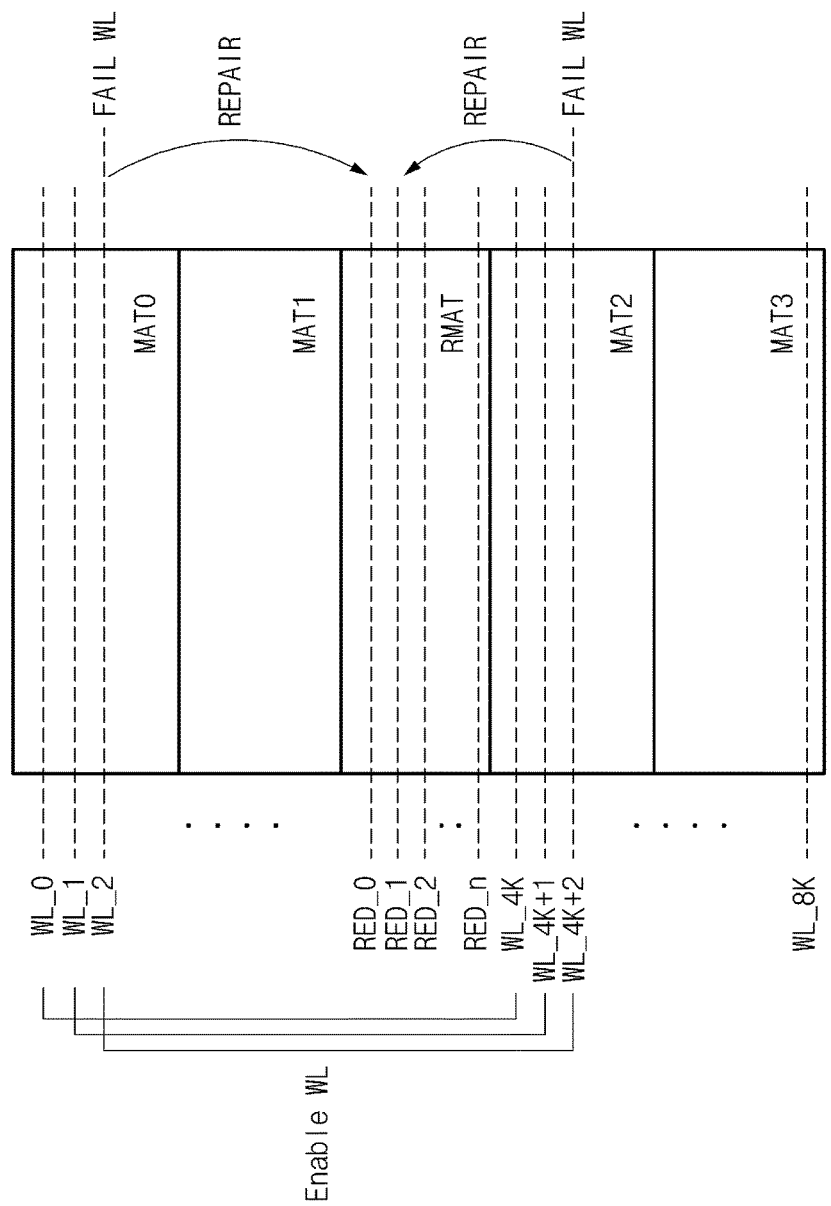
FIG. 5 is a diagram illustrating a representation of an example of a redundant operation in the semiconductor device of FIG. 3.

FIG. 5 is a diagram illustrating a representation of an example of a redundant operation in the semiconductor device of FIG. 3.

An embodiment of FIG. 5 illustrates an example where both the word lines WL_2 and WL_4K+2 simultaneously activated have failed. When the word line WL_2 of the normal mat MAT0 fails, it is substituted with the redundant word line RED_0 of the redundant mat RMAT. When the word line WL_4K+2 of the normal mat MAT2 fails, it is substituted with the redundant word line RED_1 of the redundant mat RMAT.

Figure 6:
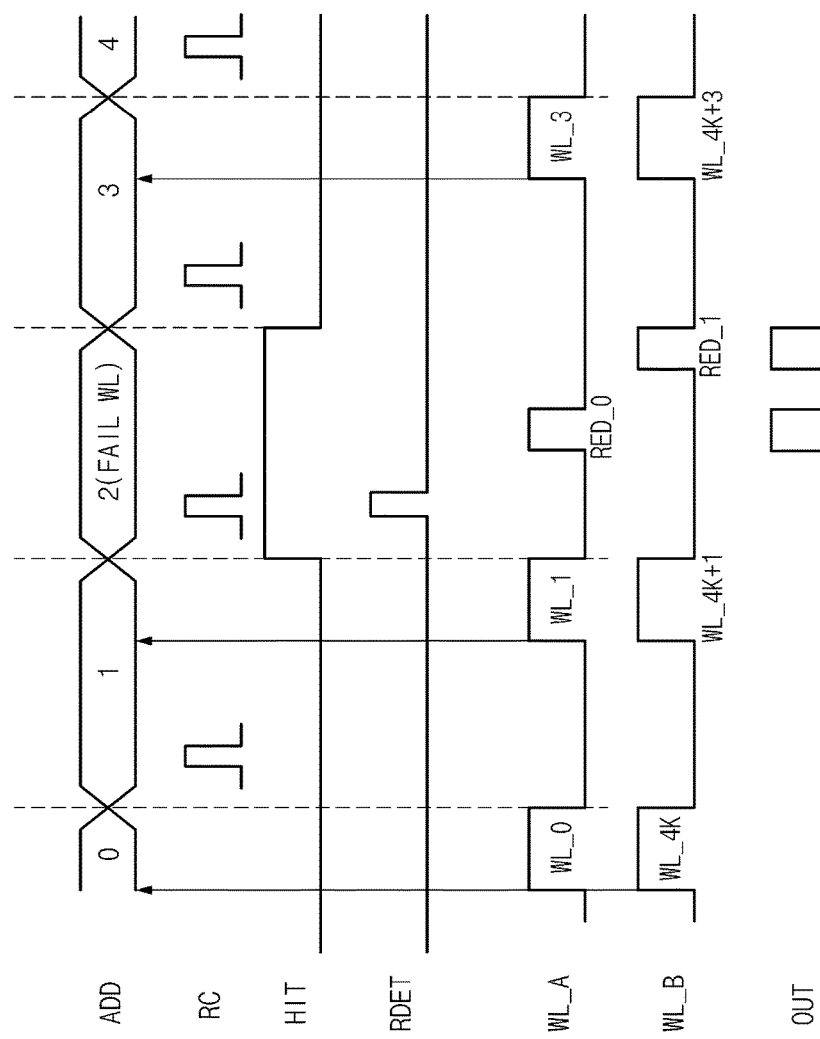
FIG. 6 is an operational timing diagram illustrating a representation of an example of a monitoring operation in the semiconductor device of FIG. 3.

FIG. 6 is an operational timing diagram illustrating a representation of an example of a monitoring operation in the semiconductor device of FIG. 3.

It may be assumed that, for example, both the word lines WL_2 and WL_4K+2 simultaneously activated as in the embodiment of FIG. 5 have failed. When the refresh command signal REFCMD is applied, the word lines WL_2 and WL_4K+2 are not activated, but the substituted redundant word lines RED_0 and RED_1 are sequentially activated when a repair operation is performed.

The monitoring unit 300 combines the signals of the word lines WL_A and WL_B substituted with the redundant word lines RED_0 and RED_1 and outputs the output signal OUT to the outside. That is, for example, the monitoring unit 300 outputs the output signal OUT of a high level when at least one of the signals of the word lines WL_A and WL_B is enabled to a high level.

If the output signal OUT of a high level is outputted twice, both the word lines WL_A and WL_B to be activated at the same time are repaired and substituted with the redundant word lines RED_0 and RED_1. That is, for example, a monitoring signal indicating that the redundant word lines RED_0 and RED_1 have been activated is outputted to the outside so that the redundant word lines RED_0 and RED_1 may be externally monitored.

An embodiment has advantages in that it can prevent the malfunction of a semiconductor device and secure the margin of a data retention time by skipping a fail word line and driving a repaired word line when two or more word lines are activated within a single bank.

Figure 7:
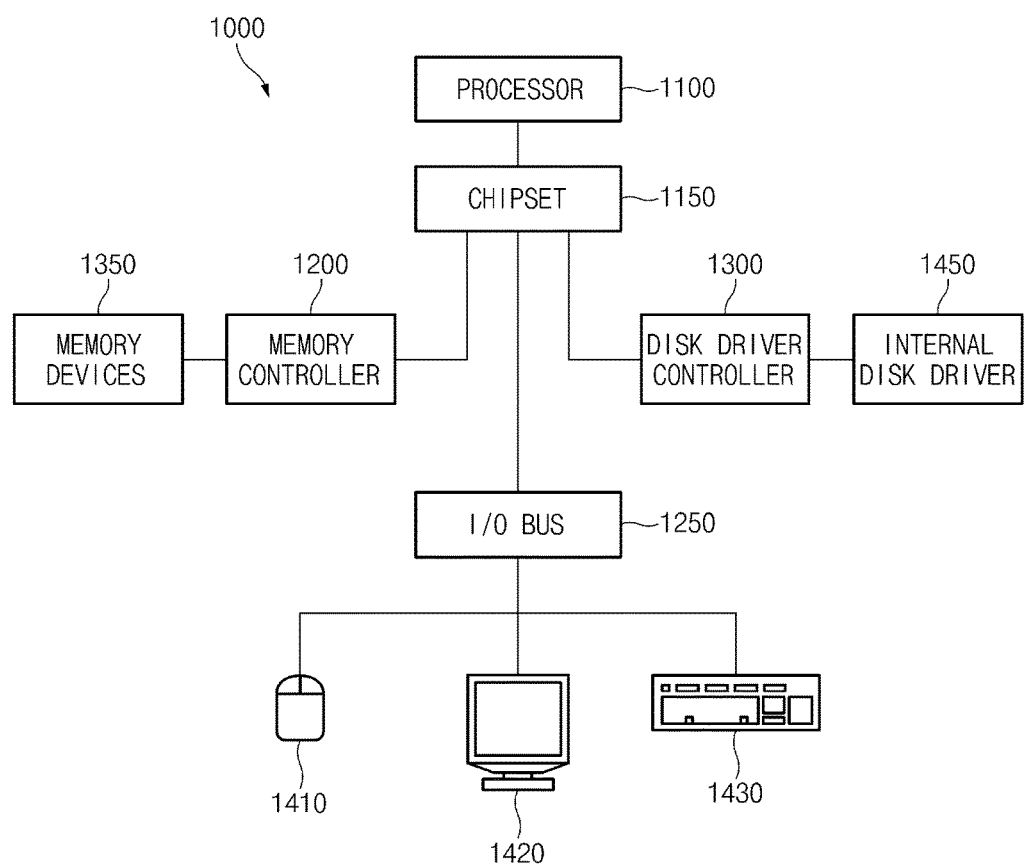
FIG. 7 illustrates a block diagram of an example of a representation of a system employing a device and/or semiconductor device in accordance with the various embodiments discussed above with relation to FIGS. 1-6.

The device and/or semiconductor device discussed above (see FIGS. 1-6) are particular useful in the design of memory devices, processors, and computer systems. For example, referring to FIG. 7, a block diagram of a system employing a device and/or semiconductor device in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one device and/or semiconductor device as discussed above with reference to FIGS. 1-6. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one device and/or semiconductor device as discussed above with relation to FIGS. 1-6, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 7 is merely one example of a system 1000 employing a device and/or semiconductor device as discussed above with relation to FIGS. 1-6. In alternate embodiments, such as, for example but not limited to, cellular phones or digital cameras, the components may differ from the embodiments illustrated in FIG. 7.

While various embodiments have been described above, it will be understood to those skilled in the art that the embodiments described are by way of example only. Accordingly, the device described herein should not be limited based on the described embodiments.

What is claimed is:

1. A semiconductor device, comprising:
    a repair detection unit configured to determine whether an inputted address is a repair address and output a repair detection signal; and
    a refresh control unit configured to simultaneously activate two or more word lines in response to a refresh command signal and sequentially activate the two or more word lines according to the repair detection signal.

2. The semiconductor device of claim 1, wherein the repair detection unit comprises:
    a repair signal generation unit configured to compare the address with the repair address and output a repair selection signal; and
    a combination unit configured to output the repair detection signal by combining the repair selection signal and a repair check signal.

3. The semiconductor device of claim 2, wherein the repair signal generation unit activates and outputs the repair selection signal if the address is the repair address.

4. The semiconductor device of claim 2, wherein the combination unit enables and outputs the repair detection signal when both the repair selection signal and the repair check signal are enabled.

5. The semiconductor device of claim 1, wherein the refresh control unit simultaneously activates at least two or more word lines which are not adjacent to each other.

6. The semiconductor device of claim 1, wherein the refresh control unit comprises:
    a word line driving control unit configured to control the two or more word lines in response to the refresh command signal so that the two or more word lines are simultaneously activated;
    a pulse width control unit configured to generate two or more word line driving signals in response to an output of the word line driving control unit; and
    a selection unit configured to select an output of the word line driving control unit or an output of the pulse width control unit in response to the repair detection signal and output the selected output to the two or more word lines.

7. The semiconductor device of claim 6, wherein the pulse width control unit controls the two or more word line driving signals so that each of the two or more word line driving signals has a pulse width different from a pulse width of the refresh command signal.

8. The semiconductor device of claim 6, wherein the pulse width control unit controls the two or more word line driving signals so that each of the two or more word line driving signals has a pulse with which is half a pulse width of the refresh command signal.

9. The semiconductor device of claim 6, wherein the selection unit selects the output of the word line driving control unit when the repair detection signal is disabled and outputs the selected output to the two or more word lines.

10. The semiconductor device of claim 6, wherein the selection unit selects the output of the pulse width control unit when the repair detection signal is enabled and sequentially outputs the selected output to the two or more word lines.

11. The semiconductor device of claim 6, wherein the selection unit comprises:
    a first selection unit configured to select the output of the word line driving control unit or the output of the pulse width control unit in response to the repair detection signal and selectively activate the first word line; and
    a second selection unit configured to select the output of the word line driving control unit or the output of the pulse width control unit in response to the repair detection signal and selectively activate the second word line.

12. The semiconductor device of claim 6, wherein the selection unit activates a first word line of the two or more word lines and activates a second word line of the two or more word lines after the first word line is deactivated.

13. The semiconductor device of claim 1, wherein when the refresh command signal is enabled, substituted redundant word lines of the two or more word lines are activated in a repair operation.

14. The semiconductor device of claim 1, further comprising a monitoring unit configured to monitor and output the two or more word lines.

15. The semiconductor device of claim 14, wherein the monitoring unit outputs an output signal by performing an OR operation on the two or more word lines.

16. The semiconductor device of claim 1, wherein the two or more word lines configured to be simultaneously activated by the refresh control unit are included in a single bank and are activated in response to a single refresh command signal.

17. A semiconductor device, comprising:
    a repair signal generation unit configured to compare an inputted address with a repair address and output a repair selection signal;
    a combination unit configured to output a repair detection signal by performing a logic operation on the repair selection signal and a repair check signal;
    a word line driving control unit configured to simultaneously activate two or more word lines in response to a refresh command signal;
    a pulse width control unit configured to generate two or more word line driving signals each having a pulse width less than a pulse width of the refresh command signal in response to an output of the word line driving control unit; and
    a selection unit configured to select an output of the word line driving control unit in response to the repair detection signal and output the selected output to the two or more word lines or to select an output of the pulse width control unit and sequentially activate the two or more word lines.

18. The semiconductor device of claim 17, wherein the combination unit enables and outputs the repair detection signal when both the repair selection signal and the repair check signal are enabled.

19. The semiconductor device of claim 17, wherein the two or more word lines are disposed to be not adjacent to each other.

20. The semiconductor device of claim 17, wherein the pulse width control unit controls the two or more word line driving signals so that each of the two or more word line driving signals has a pulse with which is half a pulse width of the refresh command signal.

21. The semiconductor device of claim 17, wherein the selection unit comprises:
a first selection unit configured to select the output of the word line driving control unit or the output of the pulse width control unit in response to the repair detection signal and selectively activate the first word line; and
a second selection unit configured to select the output of the word line driving control unit or the output of the pulse width control unit in response to the repair detection signal and selectively activate the second word line.

22. The semiconductor device of claim 17, wherein the two or more word lines configured to be simultaneously activated by the word line driving control unit are included in a single bank and are activated in response to a single refresh command signal.

23. A device for a semiconductor device, the device comprising:
a refresh control unit configured to increase a refresh rate by simultaneously activating two or more word lines included in a single bank in response to a single refresh command signal, and to sequentially activate the two or more word lines according to a repair detection signal.

24. The device, according to claim 23, further comprising:
a repair detection unit configured to determine whether an inputted address is a repair address and output the repair detection signal.

25. The device, according to claim 23, wherein the refresh control unit comprises:
a pulse width control unit configured to generate two or more word line driving signals, each having a pulse width less than a pulse width of the refresh command signal, in response to the signal refresh command signal.

* * * * *